United States Patent
Qu et al.

(10) Patent No.: US 10,139,221 B2
(45) Date of Patent: Nov. 27, 2018

(54) SUBSTRATE CARRYING DEVICE AND SUBSTRATE REGULARITY DETECTING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lianjie Qu, Beijing (CN); Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 744 days.

(21) Appl. No.: 14/402,575

(22) PCT Filed: Nov. 6, 2013

(86) PCT No.: PCT/CN2013/086642
§ 371 (c)(1),
(2) Date: Nov. 20, 2014

(87) PCT Pub. No.: WO2015/027566
PCT Pub. Date: Mar. 5, 2015

(65) Prior Publication Data
US 2016/0282109 A1    Sep. 29, 2016

(30) Foreign Application Priority Data

Aug. 30, 2013 (CN) .......................... 2013 1 0390522

(51) Int. Cl.
*G01B 11/27* (2006.01)
*H01L 21/67* (2006.01)
(Continued)

(52) U.S. Cl.
CPC ...... *G01B 11/272* (2013.01); *H01L 21/67265* (2013.01); *H01L 21/67326* (2013.01);
(Continued)

(58) Field of Classification Search
CPC ......... H01L 21/67326; H01L 21/68771; H01L 21/67346; H01L 22/20; H01L 21/67265; G01B 11/272
See application file for complete search history.

(56) References Cited

U.S. PATENT DOCUMENTS 4,007,383 A * 2/1977 Wessner ................ G06M 3/021
250/231.15
4,711,579 A * 12/1987 Wilkinson ........... G01B 11/024
250/559.24
(Continued)

FOREIGN PATENT DOCUMENTS

CN     101096243 A     1/2008
CN     101806674 A     8/2010
(Continued)

OTHER PUBLICATIONS

International Search Report and Written Opinion dated Aug. 30, 2013 regarding PCT/CN2013/086642.
(Continued)

*Primary Examiner* — Dominic J Bologna
(74) *Attorney, Agent, or Firm* — Harness, Dickey & Pierce, P.L.C.

(57) ABSTRACT

The present invention relates to a production apparatus of display device, and provides a substrate carrying device and a substrate regularity detecting method. The carrying device comprises: a carrying platform; a support frame; a signal transmitter; a signal receiver and a control device. The benefits of the invention are that by means of adopting the signal detecting device and the control device to detect the regularity of the substrates placed in the substrate carrying device, the detection of the placement of the substrates is realized, when some problems occurs, the operators can realize in time, the happening of bump damage to the
(Continued)

substrates in the following process when taking out is avoided, and the safety of the substrates is increased.

17 Claims, 3 Drawing Sheets

(51) Int. Cl.
*H01L 21/673* (2006.01)
*H01L 21/687* (2006.01)
*H01L 21/66* (2006.01)
*H01L 27/12* (2006.01)

(52) U.S. Cl.
CPC .. *H01L 21/67346* (2013.01); *H01L 21/68771* (2013.01); *H01L 22/20* (2013.01); *H01L 27/1259* (2013.01)

(56) References Cited

U.S. PATENT DOCUMENTS

| | | | |
|---|---|---|---|
| 5,184,217 A * | 2/1993 | Doering | G01N 21/8903 348/125 |
| 6,049,386 A * | 4/2000 | Stringer | G01B 11/04 250/559.24 |
| 2004/0149940 A1 * | 8/2004 | Buisker | B65H 23/0216 250/559.36 |
| 2010/0165360 A1 * | 7/2010 | Kim | G01B 11/16 356/615 |

FOREIGN PATENT DOCUMENTS

| | | |
|---|---|---|
| CN | 202138720 U | 2/2012 |
| CN | 202265109 U | 6/2012 |
| CN | 203132514 U | 8/2013 |
| JP | 01156206 | 6/1989 |
| JP | 01156210 | 6/1989 |
| JP | 01156213 | 6/1989 |
| JP | 06293411 | 10/1994 |
| JP | 2001206544 A | 7/2001 |
| JP | 4400491 B2 | 1/2010 |
| KR | 100637397 B1 | 10/2006 |
| KR | 20110052188 A | 5/2011 |

OTHER PUBLICATIONS

Chinese Office Action dated Feb. 3, 2015 regarding Chinese Application No. 201310390522.2. Translation provided by Dragon Intellectual Property Law Firm.

* cited by examiner

SUBSTRATE CARRYING DEVICE AND SUBSTRATE REGULARITY DETECTING METHOD

CROSS-REFERENCE TO RELATED APPLICATION

This application is the U.S. national phase of PCT Application No. PCT/CN2013/086642 filed on Nov. 6, 2013, which claims priority to Chinese Patent Application No. 201310390522.2 filed on Aug. 30, 2013, the disclosures of which are incorporated in their entirety by reference herein.

TECHNICAL FIELD

The present invention relates to a production apparatus of display device, especially relates to a substrate carrying device and a substrate regularity detecting method.

BACKGROUND

In production of a TFT LCD, in order to facilitate to take and use a substrate in the process, it is often put a certain number of substrates in a carrying device, as shown in FIG. 1, FIG. 1 shows a structure of the carrying device in the prior art, the carrying device comprises a carrying platform 10, a support frame 20 disposed on the carrying platform 10, the support frame 20 has several support layers 21, substrates 50 disposed in the support layers 21. When using, the substrates 50 are taken out from the inside of the support layers 21 or are put into the inside of the support layers 21 by a machine hand 60, specifically, the machine hand 60 can move in two directions of horizontal and vertical, the machine hand 60 can lay below the substrate 50 inside the support layers 21 by its extension in the horizontal direction, and places the substrates 50 on the machine hand 60 by vertical rising of a lift table, and takes out the substrates 50 when retracting, the operation of placing the substrates 50 into the support layers 21 is opposite to the above mentioned operation, and is not described in detail herein.

The defect of the prior art are that the substrates are normally need to undergo many processes, such as thin film deposition, photoetching, etching, strip, annealing and so on, in the process of the processing, it is needed to take out the substrates from the support frame or put the substrates into the support layer repeatedly by the machine hand. These operations will affect the regularity of the substrates placed in the support layers, thereby cause bump damage to the substrates in the next taking and using.

SUMMARY

The present invention provides a substrate carrying device, which can detect the regularity of the placed substrates, and increase the safety of the substrates.

A substrate carrying device provided by the embodiment of the present invention, comprising:

a carrying platform;

a support frame, disposed on said carrying platform and being movable horizontally with respect to said carrying platform, and having support layers arranged along a height direction and used to store substrates;

a signal detecting device, disposed on said carrying platform or said support frame and being movable horizontally with respect to said support frame, and comprising a signal transmitter and a signal receiver, wherein one of said signal transmitter and said signal receiver is located above the substrates that are detected and stored inside said support frame, the other of said signal transmitter and said signal receiver is located below the substrates that are detected, said signal transmitter transmits a detecting signal for detecting the side edges of the substrates along the height direction, said signal receiver receives said detecting signal;

a control device, connected with said signal receiver, for obtaining a relative displacement information of the substrates and the support frame based on the detecting signal received by the signal receiver, and determining the regularity of the substrates by a set corresponding relation.

In the above mentioned technical solution, by means of adopting the signal detecting device and the control device to detect the regularity of the substrates placed in the substrate carrying device, and the detection of the placement of the substrates is realized, when some problems occurs, the operators can realize in time, the happening of bump damage to the substrates in the following process when taking out is avoided, and the safety of the substrates is increased.

Alternatively, one of said signal transmitter and the signal receiver is placed on the top end of said support frame, and the other of said signal transmitter and said signal receiver is placed on the bottom end of said support frame, when detecting the side edges of said substrates, said support platform is fixed with respect to said carrying platform, said signal detecting device moves horizontally with respect to said carrying platform.

Alternatively, one of said signal transmitter and the signal receiver is placed on the top end of said support frame, and the other of said signal transmitter and said signal receiver is placed on said carrying platform, when detecting the side edges of said substrates, said support platform is fixed with respect to said carrying platform, said signal detecting device moves horizontally with respect to said carrying platform.

Alternatively, both of said signal transmitter and said signal receiver are placed on said carrying platform, when detecting the side edges of said substrates, said support platform moves horizontally with respect to said carrying platform, said signal detecting device is fixed with respect to said carrying platform.

Alternatively, the displacement information determines the regularity by means of the corresponding relation of the difference of the maximum value and the minimum value of the displacement information and the quantity of the substrates and the distance between adjacent substrates. Obtaining the regularity by means of the corresponding relation, so that the substrate carrying device can detect whether the substrates are placed regularly with different sized substrates placed therein.

Alternatively, said set corresponding relation in said control device is: $Ali=1-(Max(Li)-Min(Li))/D*I$; wherein, $Ali$ represents the regularity of the substrates, $I$ represents the quantity of the substrates in the support frame, $Li$ represents the relative displacement information of the substrate and the support frame, $i$ represents an integer which is greater than or equal to 1 while smaller than or equal to $I$, $D$ represents a vertical distance between two adjacent substrates.

Alternatively, one of said signal transmitter and the signal receiver is slidably assembled on the top end of said support frame, and the other of said signal transmitter and said signal receiver is fixed on the bottom end of said support frame. Since one of said signal transmitter and the signal receiver is slidably assembled and the other of said signal transmitter and said signal receiver is fixedly assembled, the regularity of glass is detected.

Alternatively, further comprising: a driving device, for driving said signal transmitter or said signal receiver slidably assembled on the top end of said support frame.

Alternatively, one of said signal transmitter and the signal receiver is fixed on the top end of said support frame, and the other of said signal transmitter and said signal receiver is slidably assembled on the bottom end of said support frame. Since one of said signal transmitter and the signal receiver is slidably assembled and the other of said signal transmitter and said signal receiver is fixedly assembled, the regularity of glass is detected.

Alternatively, further comprising: a driving device, for driving said signal transmitter or said signal receiver slidably assembled on the bottom end of said support frame.

Alternatively, said support frame is disposed on said carrying platform and slides with respect to said carrying platform, said signal transmitter and said signal receiver are fixed on said carrying platform, and said signal transmitter and said signal receiver are disposed above and below said support frame respectively. Since said signal transmitter and said signal receiver are fixedly assembled, the regularity of glass is detected in a manner of moving the support frame.

Alternatively, further comprising: a driving device, for driving said support frame to slide.

Alternatively, further comprising: an alarm, said alarm is connected with said control device, and sound the alarm when the regularity determined by the control device exceeds the set condition. Therefore, the operator can receive the information clearly.

Alternatively, the alarm is one of a light alarm and a sound alarm.

Alternatively, said signal transmitter is an infrared signal transmitter, said signal receiver is an infrared signal receiver, so that good detecting signal intensity can be provided.

The embodiments of the present invention further provides a substrate regularity detecting method, applied in the above mentioned one of the substrate carrying device, comprising the following steps:

detecting the side edges of the substrates inside the support frame by the signal detecting device and transmitting the detecting signal;

obtaining the relative displacement information of the substrates and the support frame based on the received detecting signal, and determining the regularity of the substrates based on the set corresponding relation.

Alternatively, further comprising the step of sounding the alarm when the determined regularity exceeds the set condition.

Alternatively, the regularity corresponding to said relative displacement information is the maximum value and the minimum value of the displacement information, said set condition is the safe distance of the side edges of said substrates in placing to the side wall of the adjacent support frame.

Alternatively, said set condition is the regularity of the glasses, said set corresponding relation is the difference of the maximum value and the minimum value of the relative displacement information and the quantity of the substrates and the distance between adjacent substrates.

Alternatively, said set corresponding relation is: $Ali=1-(Max(Li)-Min(Li))/D*I$; wherein, $Ali$ represents the regularity of the substrates, $I$ represents the quantity of the substrates in the support frame, $Li$ represents the relative displacement information of the substrate and the support frame, $i$ represents an integer which is greater than or equal to 1 while smaller than or equal to $I$, $D$ is a vertical distance between two adjacent substrates.

By means of the above mentioned method, the regularity of the substrates placed inside the support frame can be detected, the bump damage to the substrates in the following taking is avoided, and the safety of the substrates is increased.

| Drawing reference signs: | | | |
|---|---|---|---|
| 10-carrying platform | 20-support frame | 21-support layer | 30-signal transmitter |
| 31-signal receiver | 40-control device | 50-substrate | |

DETAILED DESCRIPTION

In order to detect the regularity of the substrates placed in the substrate carrying device, the present invention provides a substrate carrying device, in the technical solution of the present invention, the side edges of the substrates are detected by a signal detecting device, when a detecting signal received by a signal receiver attenuates, a control device determines the regularity of the substrates based on an obtained displacement information and a set responding relation, thereby detects the regularity of the substrates placed in the substrate carrying device, and the bump damage to the substrates in the following taking substrates process is avoided. It should be noted that the substrates carried by the substrate carrying device of the present invention can be substrates of any materials such as glass substrates, plastic substrates, metal substrates or quartz substrates, also can be any other flat structures, or any other structures of requiring neat edges. In order to make the objects, technical solution, and advantages of the present invention more clear, the invention will be further described in detail through embodiments.

Figure 1:
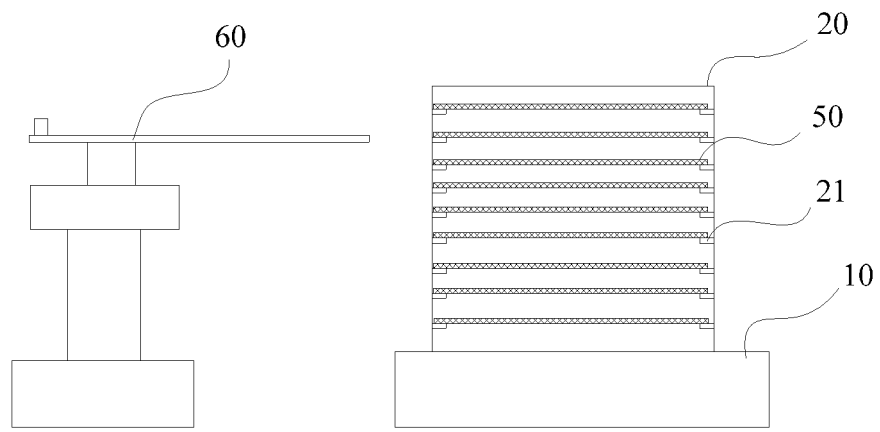
FIG. 1 shows a using reference view of a substrate carrying device in the prior art.
Figure 2:
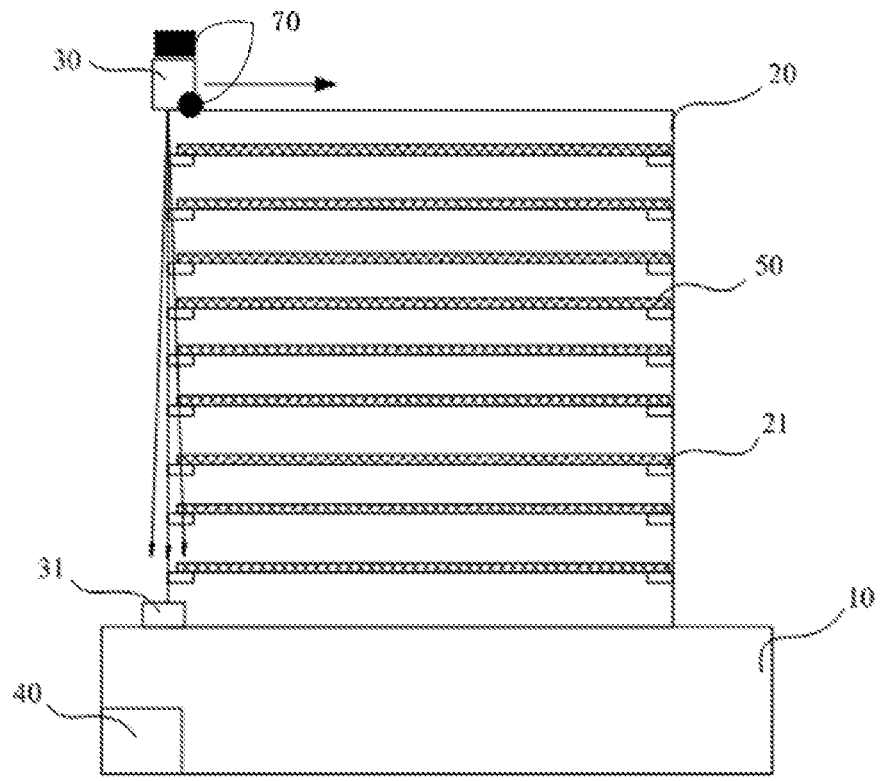
FIG. 2 shows a structural schematic view of a substrate carrying device provided by an embodiment of the present invention.

As shown in FIG. 2, FIG. 2 shows a structural schematic view of a substrate carrying device provided by an embodiment of the present invention.

The substrate carrying device provided by the embodiment of the present invention comprises:

a carrying platform 10;

a support frame 20 disposed on the carrying platform 10, the support frame 20 has several support layers 21 arranged along a height direction and used to store substrates 50;

a signal detecting device disposed on the carrying platform 10 or the support frame 20 and being movable horizontally with respect to the support frame 20, the signal detecting device comprises a signal transmitter 30 and a signal receiver 31, wherein one of the signal transmitter 30 and the signal receiver 31 is located above the several substrates 50 that are detected and stored inside the support frame 20, the other of the signal transmitter 30 and the signal receiver 31 is located below the several substrates 50 that are detected, the signal transmitter 30 transmits a detecting signal for detecting the side edges of several substrates 50 along the height direction, the signal receiver 31 receives the detecting signal;

a control device 40, connected with the signal receiver 31, for obtaining a relative displacement information of the substrates 50 and the support frame 20 based on the detecting signal received by the signal receiver 31, and determining the regularity of the substrates by a set corresponding relation.

Figure 3:
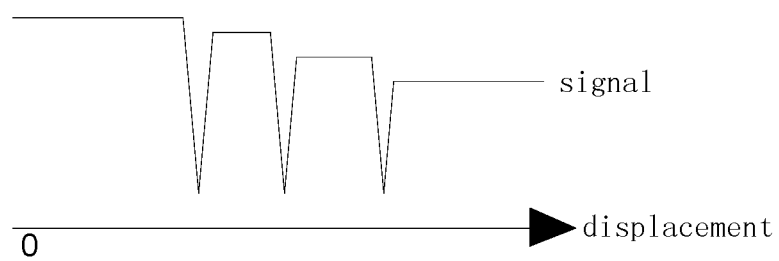
FIG. 3 shows a schematic view of a detecting signal received by a signal receiver provided by an embodiment of the present invention.

In the above mentioned embodiment, the substrate 50 is horizontally placed inside the support layers 21 of the support frame 20, the detecting signal for detecting the side edges of the substrates 50 is emitted by the signal transmitter 30, after detecting the side edges of the substrates 50, the detecting signal scatters on the side edges of the substrates 50, which causes the detecting signal intensity received by the signal receiver 31 attenuates, as shown in FIG. 3, an image of the received detecting signal has a wave trough, the location of the wave trough is the detecting signal at the time of detecting the side edges of the substrates 50. When detecting, one of the signal transmitter 30 and the signal receiver 31 moves with respect to the support frame 20 in the horizontal direction, that is to say one of the signal transmitter 30 and the signal receiver 31 moves with respect to the substrates 50, thereby scans the side edges of the glasses in turn, when the substrates 50 are placed regularly, the signal receiver 31 receives one attenuate detecting signal, when the substrates 50 are placed irregularly, the signal receiver 31 receives several attenuate detecting signals, and the attenuate detecting signals are obtained through the relative movement between one of the signal transmitter 30, the signal receiver 31 and the support frame 20, and the relative displacement information of the corresponding substrates 50 and the support frame 20 is obtained, and the regularity of the substrates is obtained by the set corresponding relation, when the regularity exceeds the set condition, the substrate 50 can be placed regularly by means of manual or mechanical operation, the bump damage to the substrates in the following taking substrates processes is avoided, and the safety of the substrates is increased.

Alternatively, the substrate carrying device further comprising: an alarm (not shown in the Figures), the alarm is connected to the control device and sound the alarm when the regularity determined by the control device exceeds the set condition and sound the alarm when the detected regularity exceeds the set condition.

The regularity corresponding to the relative displacement information can be the maximum value and the minimum value of the displacement information, the set condition can be the safe distance of the side edges of the substrates 50 to the side wall of the adjacent support frame 20 when placing the substrates 50. When the maximum value and the minimum value of the relative displacement information are within the set condition, the whole substrates will be safe when placing or taking.

Alternatively, the set condition can be the regularity of the glasses, wherein the set corresponding relative relation is the corresponding relation of the difference of the maximum value and the minimum value of the relative displacement information and the quantity of the substrates and the distance between adjacent substrates, preferably, the set corresponding relation is:

$$Ali = 1 - (\text{Max}(Li) - \text{Min}(Li))/D*I;$$

Wherein, Ali represents the regularity of the substrates 50, I represents the quantity of the substrates 50 in the support frame 20, Li represents the relative displacement information of the substrates and the support frame 20, i.e., the distance of the substrates 50 to the side wall of the adjacent support frame 20, i represents a integer which is greater than or equal to 1 while smaller than or equal to I; that is to say, the distance of a first substrate 50 to the side wall of the support frame 20 is L1, the distance of a second substrate 50 to the side wall of the support frame 20 is L2, and so on; D represents a vertical distance between two adjacent substrates 50. Input the range of the regularity into the control device 40, for example the requirement is satisfied when the regularity is between 0~0.7. At this time the detected regularity can be any value between 0~0.7 such as 0.1, 0.2, 0.3, 0.5, 0.6. When the sizes of the detected substrates 50 placed inside the support frame 20 are different, it is only needed to set the range of the regularity, without setting the value for the substrates of each size, when detecting, the collected information is judged by using the above mentioned formula directly, thereby the detecting range of the substrate carrying device is enlarged, and the use of the substrate 50 carrying device is facilitated.

The detection of the regularity of the substrates 50 placed in the substrate 50 carrying device is realized by the signal detecting device and the control device 40. The happening of the bump damage to the substrates in the following taking process is avoided.

When detecting the regularity of the substrates 50, ensuring that at least one of the signal transmitter 30 and the signal receiver 31 can move with respect to the substrates 50, also the signal transmitter 30 and the signal receiver 31 can move with respect to the substrate 50 synchronous. In the real production, different structures can be adopted to meet above demand. Hereinafter, taking that one of the signal transmitter 30 and the signal receiver 31 can move with respect to the substrate 50 as an example to illustrate the mounting structure of the signal detecting device.

A First Embodiment

Keeping on referring to FIG. 2, one of the signal transmitter 30 and the signal receiver 31 is slidably assembled on the top end of the support frame 20, and the other of the signal transmitter 30 and the signal receiver 31 is fixed on the bottom end of the support frame 20.

Specifically, the signal transmitter 30 is slidably assembled on the top end of the support frame 20, and in the course of moving, the detecting signal emitted by which can scan the side edges of all the placed substrates 50, and the signal receiver 31 is fixed on the bottom end of the support frame 20, and can receive the detecting signal emitted by the signal transmitter 30. Alternatively, the signal receiver 31 is slidably assembled on the top end of the support frame 20, the signal transmitter 30 is fixed on the bottom end of the support frame 20, the operational principle is the same, hereinafter taking the structure of slidably assembled of the signal transmitter 30 as an example to illustrate.

The signal transmitter 30 emits the detecting signal when moving, the detecting signal scans the side edges of the substrates 50 along with the movement of the signal transmitter 30, meanwhile, the signal receiver 31 receives the detecting signal which has scanned the side edges of the substrates 50, when the detecting signal detects the side edges of the substrates 50, the detecting signal scatters on the side edges of the substrates 50, which causes the detecting signal intensity received by the signal receiver 31 attenuates. At the same time, the control device 40 connected to the signal receiver 31 records the attenuated detecting signal, and obtains the relative displacement information of the substrates and the support frame, compares the regularity which is determined based on the set corresponding relation with the set condition, and sound the alarm when the regularity exceeds the set condition.

A Second Embodiment

Figure 4:
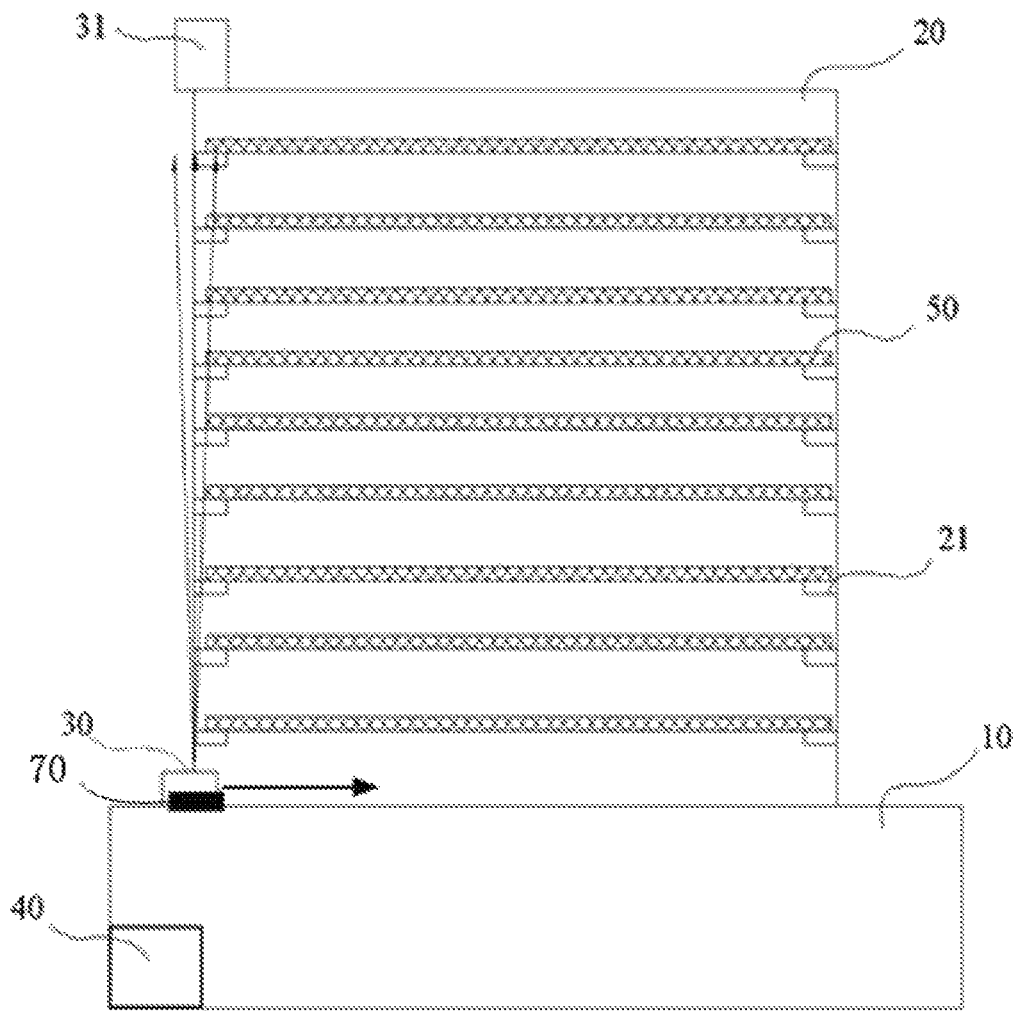
FIG. 4 shows a structural schematic view of a substrate carrying device provided by another embodiment of the present invention.

As shown in FIG. 4, FIG. 4 shows a structural schematic view of a substrate carrying device provided by the embodiment of the present invention. One of the signal transmitter 30 and the signal receiver 31 is fixed on the top end of the support frame 20, and the other of the signal transmitter 30 and the signal receiver 31 is slidably assembled on the bottom end of the support frame 20.

Specifically, the signal receiver 31 is fixed on the top end of the support frame 20, the signal transmitter 30 is slidably assembled on the bottom end of the support frame 20. At this time, the detecting signal emitted by the signal transmitter 30 can cover a certain region, the side edges of the substrates 50 to be detected are within the region. When the signal transmitter 30 is sliding, it can receive the detecting signal which has scanned the side edges of the substrates 50, meanwhile, the control device 40 obtains the relative displacement of the support frame 20 and the substrates 50 when the detecting signal is attenuating, and determines the regularity of the substrates based on the set corresponding relation, and sound the alarm when the regularity exceeds the set condition. In addition, it also can adopt that the signal transmitter 30 fixed on the top end of the support frame 20 and the signal receiver 31 sildably assembled on the bottom end of the support frame 20, the principle of which is the same as the above mentioned working principle, and will not be described in detail herein.

A Third Embodiment

Figure 5:
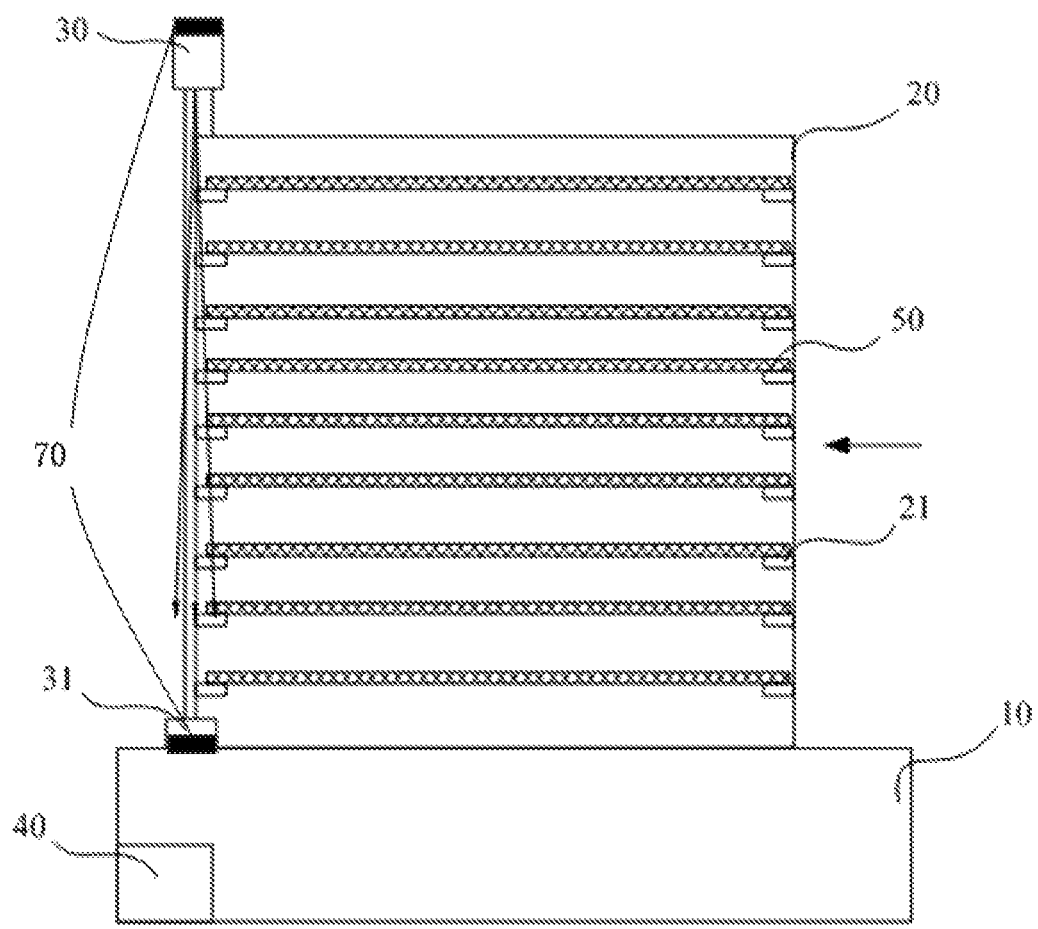
FIG. 5 shows a structural schematic view of a substrate carrying device provided by yet another embodiment of the present invention.

As shown in FIG. 5, FIG. 5 shows a structural schematic view of a substrate carrying device provided by the embodiment of the present invention. The signal transmitter 30 and the signal receiver 31 are fixed on a carrying base, and the signal transmitter 30 and the signal receiver 31 are disposed above and below the support frame 20 respectively, and detect the side edges of the substrates 50 when the support frame 20 is pushed on the carrying platform 10.

Specifically, the signal transmitter 30 and the signal receiver 31 are fixed on the carrying platform 10, and one of the signal transmitter 30 and the signal receiver 31 is disposed on the top end of the support frame 20, the other of the signal transmitter 30 and the signal receiver 31 is disposed on the bottom end of the support frame 20. Hereinafter taking the structure of the signal transmitter 30 being disposed on the top end as an example to illustrate. The signal transmitter 30 emits the detecting signal for detecting the side edges of the substrates 50, the signal receiver 31 receives the detecting signal. The support frame 20 is disposed on the carrying platform 10 and can slide relatively. When detecting, the support frame 20 is pushed horizontally, thereby the side edges of the substrates 50 are detected in turn by the signal detect device consist of the signal transmitter 30 and the signal receiver 31, and the control device 40 records the intensity of the detecting signal received by the signal receiver 31 and the displacement information, and compares the displacement information and the regularity determined by the set corresponding relation with the set condition, and sound the alarm when the regularity exceeds the set condition.

It can be seen from the above mentioned specific embodiments that when detecting the substrates 50, as long as the detecting device can move with respect to the support frame 20 and the detecting signal emitted by the signal transmitter 30 can scan the side edges of the substrates 50, the specific structure of the above mentioned detailed description should not be limited, any structures which can realize the above relative movement can be applied in the invention, for example, the support frame 20 is fixed on the carrying platform 10, the signal detecting device is slidably assembled on the carrying platform 10, i.e., the signal transmitter 30 and the signal receiver 31 slides with respect to the support frame 20, thereby the detection of the substrate 50 by the detecting signal is realized. The application principle of which is the same as the principle of the above mentioned specific embodiments, and will not describe in detail herein.

In the above mentioned specific embodiments, relative movements exist between the signal transmitter 30, the signal receiver 31 and the support frame 20, when the relative movement occurs, it can be driven by manual operation and also by a driving device 70. In the case of adopting the driving device to drive, in the first embodiment shown in FIG. 2, the driving device 70 drives the signal transmitter or the signal receiver slidably assembled on the top end of the support frame. In the second embodiment shown in FIG. 4, the driving device 70 drives the signal transmitter or the signal receiver slidably assembled on the bottom end of the support frame. In the third embodiment shown in FIG. 5, the driving device drives 70 the support frame to slide.

In the above mentioned specific embodiments, the alarm sounded by the alarm (not shown in the Fig) can be one of a light alarm and an audio alarm, and also can be a light alarm and an audio alarm.

Wherein the signal transmitter 30 can be an infrared signal transmitter, the signal receiver 31 can be an infrared signal receiver, so that good detecting signal intensity can be provided.

The embodiment of the present invention further provides a substrate regularity detecting method, comprising the following steps:

detecting the side edges of the substrates inside the support frame by the signal detecting device and transmitting the detecting signal;

obtaining the relative displacement information of the substrates and the support frame based on the received detecting signal, and determining the regularity of the substrates based on the set corresponding relation.

Preferably, sounding the alarm when the determined regularity exceeds the set condition.

Wherein, the displacement information determines the regularity based on the corresponding relation set by difference of the maximum value and the minimum value of the displacement information and the quantity of the substrates to be detected and the distance between adjacent substrates.

Preferably, the set corresponding relation is: $Ali=1-(Max(Li)-Min(Li))/D*I$; wherein, Ali represents the regularity of the substrates, I represents the quantity of the substrates in the support frame, Li represents the relative displacement information between the substrate and the support frame, i represents a integer which is greater than or equal to 1 while smaller than or equal to I, D represents a vertical distance between two adjacent substrates.

It can be seen from the above mentioned method that detecting the side edges of the substrates by the detecting signal, determining the regularity of the glasses by the set condition in the control device and the obtained displacement information, and sounding the alarm when the regularity exceeds the set condition to remind the operator to adjust the placement of the substrates. The bump damage to the substrates 50 in the following taking course is avoided, and the safety of the substrates is increased.

Obviously, those skilled in the art can make some changes and modifications on the invention without departing from the spirit and the scope of the present invention. In this way, if these changes and modifications of the present invention belong to the range of the claims and equivalent solution, the present invention means to contain these changes and modifications.

The described above are only the preferred embodiments of the present invention, it should be pointed out that, it can be made some improvements and embellish on the premise of without departing from the principle of by those skilled in the art, these improvements and embellish should be seen as the protection scope of the present invention as well.

What is claimed is:

1. A substrate carrying device, comprising:
   a carrying platform;
   a support frame disposed on said carrying platform and being movable horizontally with respect to said carrying platform, and having support layers arranged along a height direction and used to store substrates;
   a signal detecting device disposed on said carrying platform or said support frame and being movable horizontally with respect to said support frame, and comprising a signal transmitter and a signal receiver, wherein one of said signal transmitter and said signal receiver is located above the substrates that are detected and stored inside said support frame, the other of said signal transmitter and said signal receiver is located below the substrates that are detected, said signal transmitter transmits a detecting signal for detecting side edges of the substrates along the height direction, said signal receiver receives an attenuated detecting signal indicative of a displacement of the substrates and the support frame;
   a control device, connected with said signal receiver, for determining a relative displacement information of the substrates and the support frame based on the attenuated detecting signal received by the signal receiver and determining a regularity of the substrates by a set corresponding relation, wherein the detecting signal is an infrared signal.

2. The substrate carrying device according to claim 1, wherein,
   one of said signal transmitter and the signal receiver is placed on a top end of said support frame, and the other of said signal transmitter and said signal receiver is placed on a bottom end of said support frame,
   when detecting the side edges of said substrates, said support frame is fixed with respect to said carrying platform, said signal detecting device moves horizontally with respect to said carrying platform.

3. The substrate carrying device according to claim 1, wherein,
   both of said signal transmitter and said signal receiver are placed on said carrying platform,
   when detecting the side edges of said substrates, said support frame moves horizontally with respect to said carrying platform, said signal detecting device is fixed with respect to said carrying platform.

4. The substrate carrying device according to claim 1, wherein,
   said set corresponding relation in said control device is:
   $Ali = 1 - (Max(Li) - Min(Li))/ D*I$; wherein, Ali represents the regularity of the substrates, I represents a quantity of the substrates in the support frame, Li represents the relative displacement information of the substrate and the support frame, i represents an integer which is greater than or equal to 1 while smaller than or equal to I, D represents a vertical distance between two adjacent substrates.

5. The substrate carrying device according to claim 1, wherein,
   one of said signal transmitter and the signal receiver is slidably assembled on a top end of said support frame, and the other of said signal transmitter and said signal receiver is fixed on a bottom end of said support frame.

6. The substrate carrying device according to claim 1, wherein,
   one of said signal transmitter and the signal receiver is fixed on a top end of said support frame, and the other of said signal transmitter and said signal receiver is slidably assembled on a bottom end of said support frame.

7. The substrate carrying device according to claim 1, wherein,
   said support frame is disposed on said carrying platform and slides with respect to said carrying platform, said signal transmitter and said signal receiver are fixed on said carrying platform, and said signal transmitter and said signal receiver are disposed above and below said support frame respectively.

8. The substrate carrying device according to claim 1, further comprising:
   an alarm connected with said control device, and said control device initiates the alarm when the regularity determined by the control device exceeds a set condition.

9. The substrate carrying device according to claim 8, wherein,
   the alarm is one of a light alarm and a sound alarm.

10. The substrate carrying device according to claim 8, wherein,
    said signal transmitter is an infrared signal transmitter said signal receiver is an infrared signal receiver.

11. The substrate carrying device according to claim 1, wherein,
    said signal transmitter is an infrared signal transmitter, said signal receiver is an infrared signal receiver.

12. A substrate regularity detecting method, applied in said substrate carrying device according to claim 1, comprising:
    detecting side edges of the substrates inside the support frame by the signal detecting device and transmitting an attenuated detecting signal indicative of displacement of the substrates and the support frame;
    determining the relative displacement information of the substrates and the support frame based on the received attenuated detecting signal and determining the regularity of the substrates based on the set corresponding relation.

13. The substrate regularity detecting method according to claim 12, further comprising:
    initiating an alarm when the determined regularity exceeds a set condition.

14. The substrate regularity detecting method according to claim 13, wherein,
    the regularity corresponding to said relative displacement information is the maximum value and the minimum value of the displacement information, said set condition is a safe distance of the side edges of said substrates in placing to a side wall of an adjacent support frame.

15. The substrate regularity detecting method according to claim 13, wherein,
said set condition is the regularity of the substrates, said set corresponding relation is the corresponding relation among a difference of the maximum value and the minimum value of the relative displacement information and a quantity of the substrates and a distance between adjacent substrates.

16. The substrate regularity detecting method according to claim 12, wherein,
said set corresponding relation is: $Ali=1-(Max(Li)-Min(Li))/D*I$; wherein, $Ali$ represents the regularity of the substrates, $I$ represents a quantity of the substrates in the support frame, $Li$ represents the relative displacement information of the substrate and the support frame, $i$ represents an integer which is greater than or equal to 1 while smaller than or equal to $I$, $D$ represents a vertical distance between two adjacent substrates.

17. The substrate carrying device according to claim 1, wherein,
one of said signal transmitter and the signal receiver is placed on a top end of said support frame, and the other of said signal transmitter and said signal receiver is placed on said carrying platform,
when detecting the side edges of said substrates, said support platform is fixed with respect to said carrying platform, said signal detecting device moves horizontally with respect to said carrying platform.

* * * * *